US010684660B1

(12) United States Patent
Eichelberg et al.

(10) Patent No.: US 10,684,660 B1
(45) Date of Patent: Jun. 16, 2020

(54) COOLING SYSTEM FOR DATA CENTER

(71) Applicant: Amazon Technologies, Inc., Reno, NV (US)

(72) Inventors: John William Eichelberg, Spokane, WA (US); Brock Robert Gardner, Seattle, WA (US); Alan Donald Gillooly, Auburn, WA (US)

(73) Assignee: Amazon Technologies, Inc., Reno, NV (US)

( * ) Notice: Subject to any disclaimer, the term of this patent is extended or adjusted under 35 U.S.C. 154(b) by 240 days.

(21) Appl. No.: 15/600,631

(22) Filed: May 19, 2017

Related U.S. Application Data

(62) Division of application No. 14/100,371, filed on Dec. 9, 2013, now Pat. No. 9,690,337.

(51) Int. Cl.
*G06F 1/20* (2006.01)
*H05K 7/20* (2006.01)

(52) U.S. Cl.
CPC ........... *G06F 1/20* (2013.01); *H05K 7/20709* (2013.01)

(58) Field of Classification Search
CPC ........... H05K 7/20745; H05K 7/20827; H05K 7/20736; H05K 7/20272; H05K 7/20327; H05K 7/20345; H05K 7/20654; H05K 7/2069; H05K 7/2079; F24F 5/0035; F24F 2001/0085; F24F 2001/0088
See application file for complete search history.

(56) References Cited

U.S. PATENT DOCUMENTS

| | | |
|---|---|---|
| 6,178,762 B1 | 1/2001 | Flax |
| 9,313,929 B1 | 4/2016 | Malone et al. |
| 9,320,177 B2 | 4/2016 | Levesque |
| 2006/0191278 A1 | 8/2006 | Cooke |
| 2009/0014397 A1 | 1/2009 | Moss et al. |
| 2009/0156114 A1 | 6/2009 | Ahladas et al. |
| 2011/0175498 A1 | 7/2011 | Bash et al. |
| 2014/0157692 A1 | 6/2014 | Parizeau et al. |
| 2014/0223946 A1 | 8/2014 | Hall |

*Primary Examiner* — Elizabeth J Martin
(74) *Attorney, Agent, or Firm* — BakerHostetler

(57) ABSTRACT

A data center can include at least one computing room, and at least one rack system disposed in the computing room. The rack system includes a rack housing and a plurality of computing devices mounted to the rack housing. The data center can further include a cooling system that includes at least one surface that is wetted with a liquid, and delivers source air across the at least one surface such that heat is transferred from the source air to the liquid so as to produce cold air. The cold air then flows into a cold air aisle and is received in the computing devices so as to cool the computing devices.

20 Claims, 10 Drawing Sheets

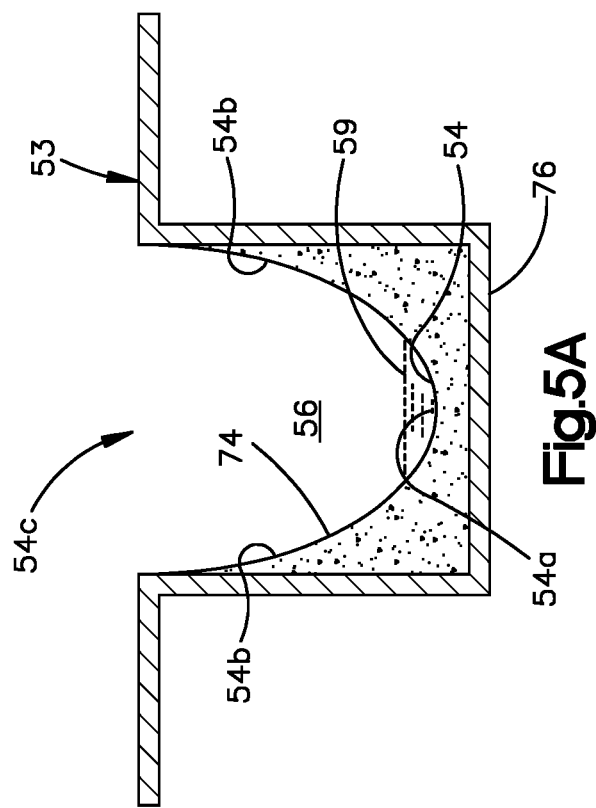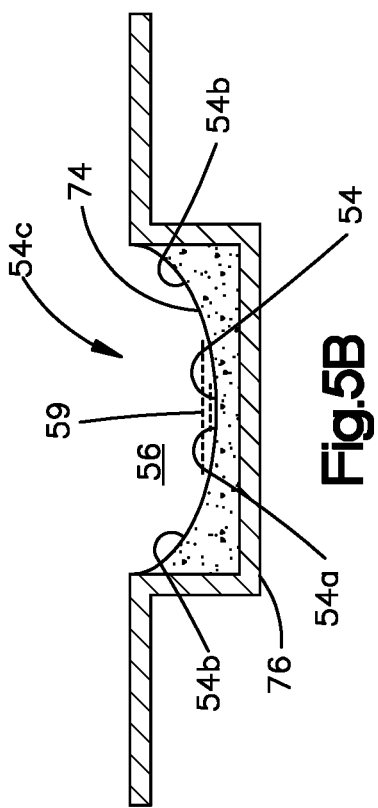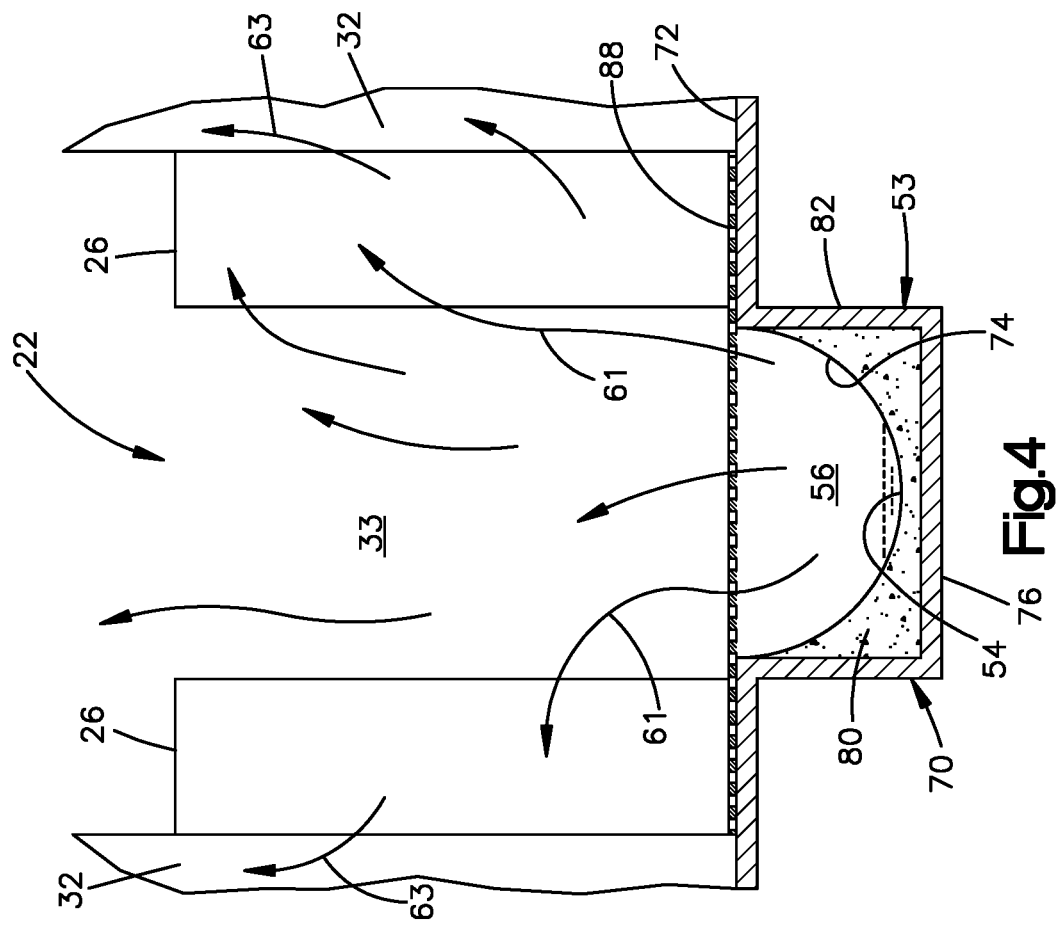

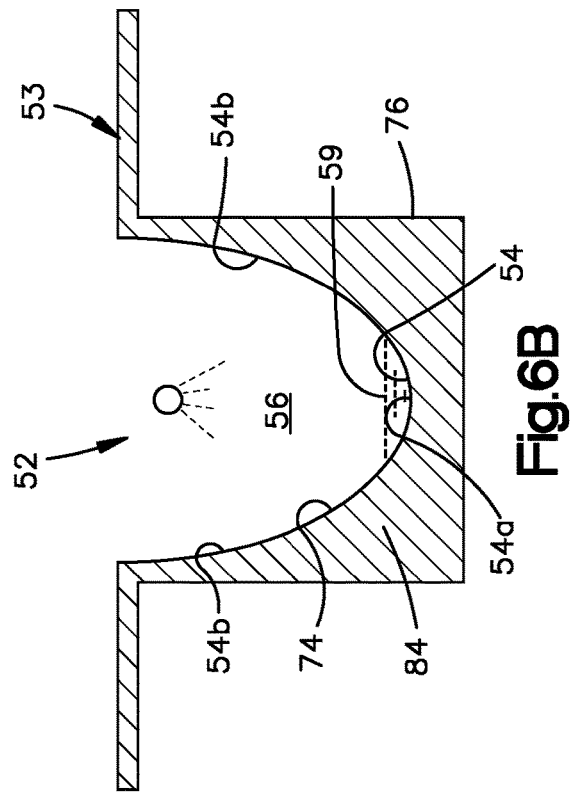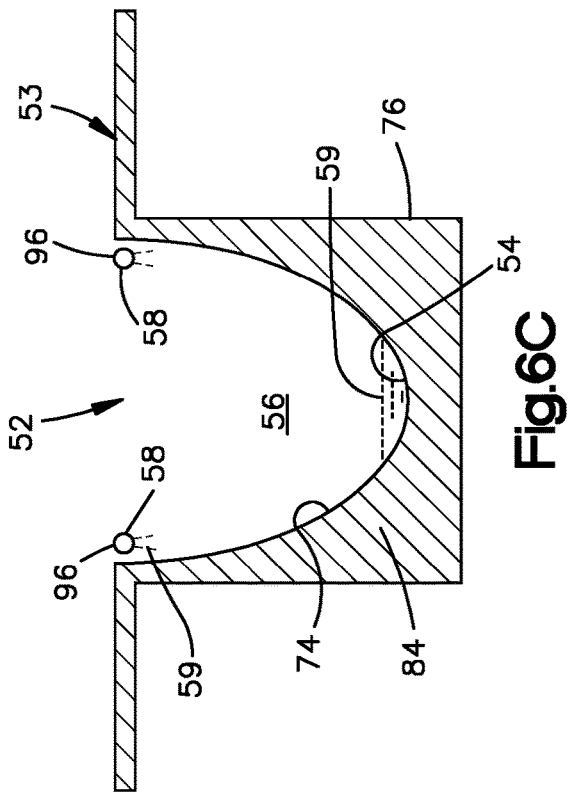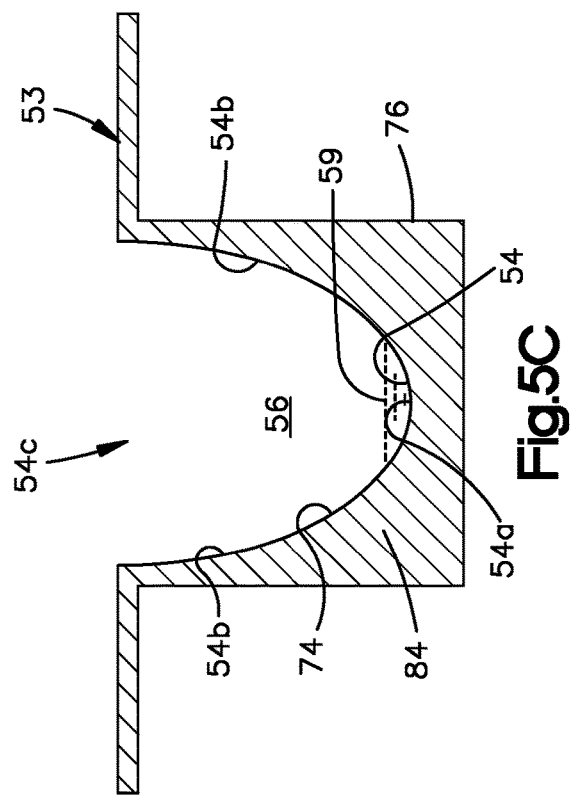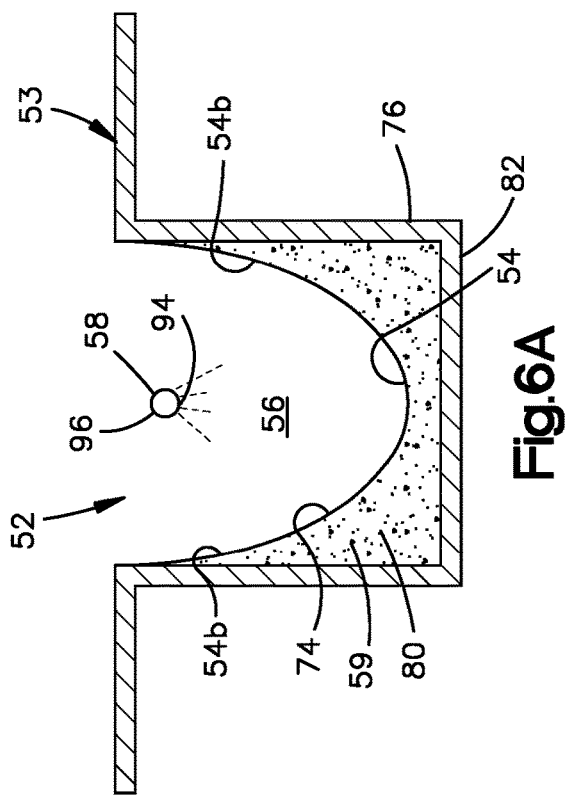

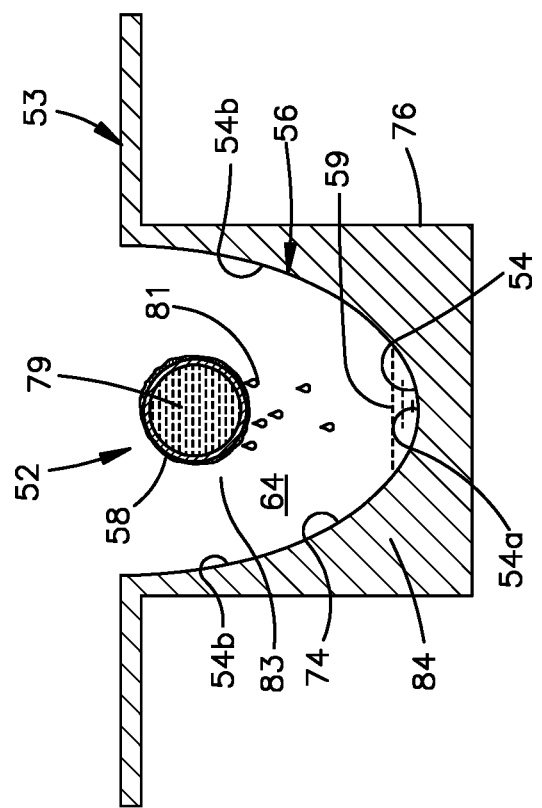
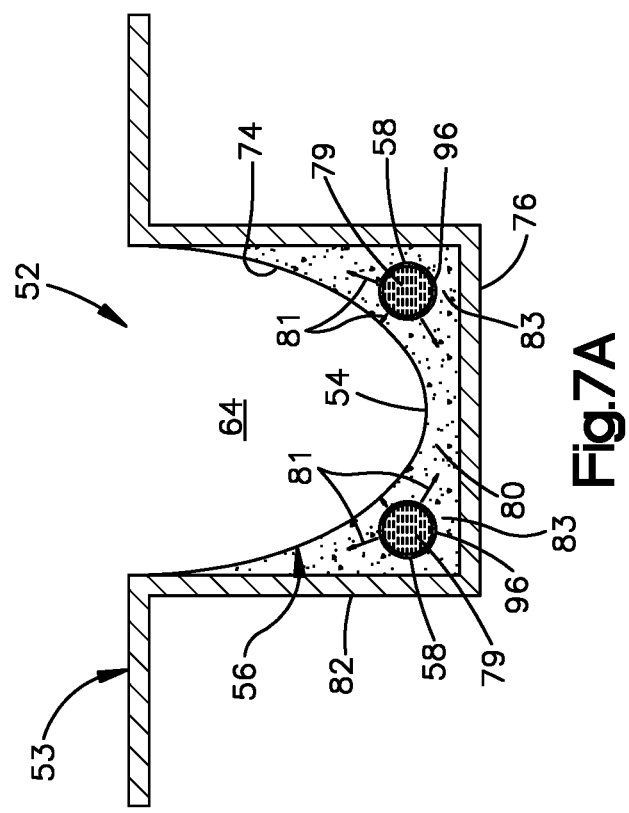

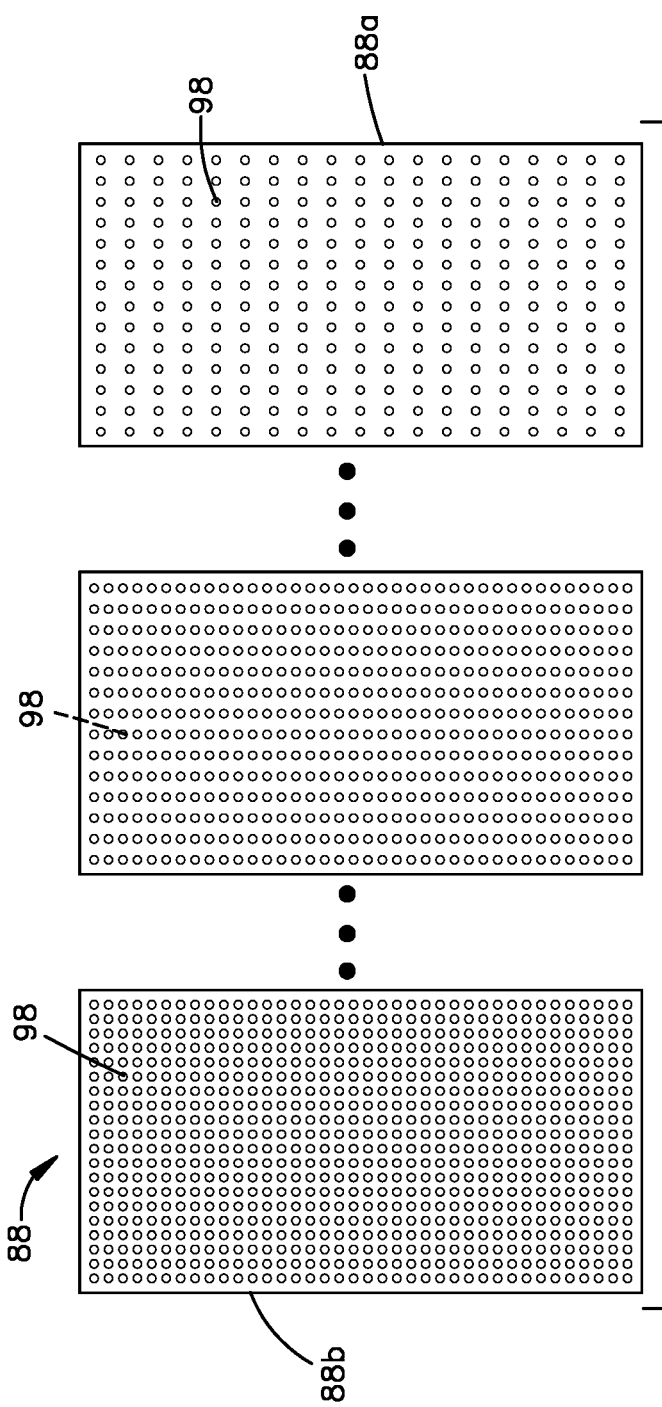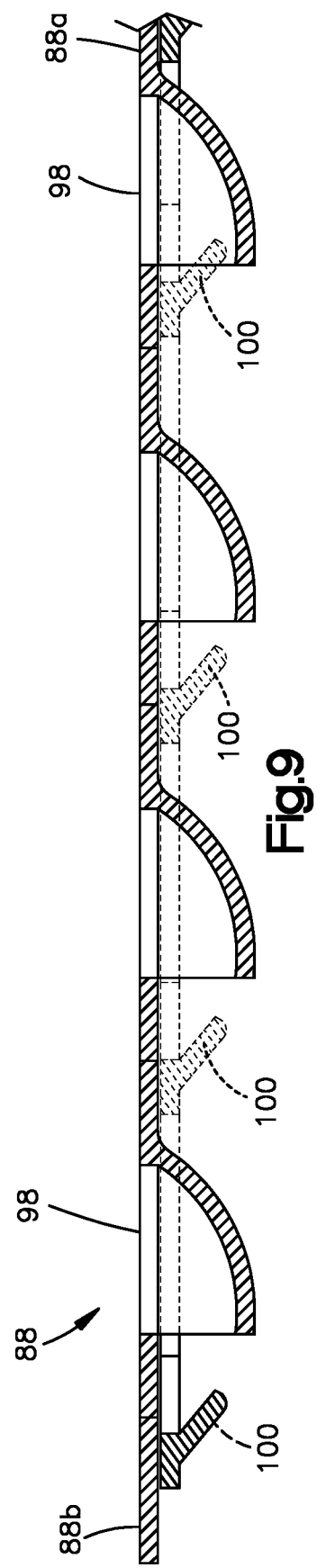

COOLING SYSTEM FOR DATA CENTER

CROSS REFERENCE TO RELATED APPLICATIONS

The present application is a divisional of U.S. patent application Ser. No. 14/100,371, entitled "COOLING SYSTEM FOR DATA CENTER", filed Dec. 9, 2013, the entirety of which is hereby incorporated by reference.

BACKGROUND

Computing-intensive or data-intensive organizations such as on-line retailers, Internet service providers, search providers, financial institutions, and the like often conduct computer operations from large scale computing facilities, known as data centers. Such computing facilities house and accommodate a large number of server, network, and other computer equipment suitable to process, store, and exchange data as desired to facilitate the organization's operations. Data centers can be located local to the organization or remote from the organization, such that data can be exchanged to and from the data center over a hard wire, over the internet, or a combination of the two. Typically, a computer room of a data center includes many racks that each includes a rack housing that supports a plurality of brackets that are spaced from one another so as to define a corresponding plurality of mounting slots, otherwise known as bays. The racks are configured to support a respective plurality of servers that are rack-mounted to the rack housing in the bays so as to define a rack system.

Data centers typically include a number of components that generate a significant amount of waste heat during operation. Such components include printed circuit boards, mass data storage devices, power supplies, and processors. For example, some computers with multiple processors can generate 250 watts of waste heat. For example, a standard 19-inch rack may hold ten to twenty servers of various heights of 1U, 2U, and 3U (wherein "U" designates a rack unit of 1.75 inches). Some conventional rack systems can include up to forty or more such rack-mounted components, and such rack systems can generate as much as 10 kilowatts of waste heat. It is thus recognized that removal of waste heat is a significant challenge in the day-to-day management of data centers.

One conventional attempt to thermally regulate rack systems includes the division of the data center room into hot air aisles and cold air aisles. Cold air is fed into the cold air aisle, such that internal fans of the individual servers draw the cold air from the cold air aisle so that the cold air flows around various server components, and expel heated air into the hot air aisle. It should thus be appreciated that the racks are open to both the cold air aisles and the warm air aisles. Conventional air cooling systems often require large amounts of energy to cool the air that is delivered to the cold air aisle, and are thus inefficient.

BRIEF DESCRIPTION OF THE DRAWINGS

The following detailed description will be better understood when read in conjunction with the appended drawings, in which there is shown in the drawings example embodiments for the purposes of illustration. It should be understood, however, that the present disclosure is not limited to the precise arrangements and instrumentalities shown. In the drawings:

FIG. 4 is an enlarged sectional end elevation view of a portion of the data center illustrated in FIG. 2B, showing a liquid distribution member of the liquid distribution system;

FIG. 5A is a sectional end elevation view of the liquid distribution member as illustrated in FIG. 4, but constructed in accordance with an alternative embodiment;

FIG. 5B is a sectional end elevation view of the liquid distribution member as illustrated in FIG. 5A, but constructed in accordance with an alternative embodiment;

FIG. 5C is a sectional end elevation view of the liquid distribution member as illustrated in FIG. 5A, but constructed in accordance with an alternative embodiment;

FIG. 6A is a sectional end elevation view of a portion of the liquid distribution system illustrated in FIG. 1;

FIG. 6B is a sectional end elevation view of a portion of the liquid distribution system as illustrated in FIG. 6A, but constructed in accordance with an alternative embodiment;

FIG. 6C is a sectional end elevation view of a portion of the liquid distribution system as illustrated in FIG. 6A, but constructed in accordance with an alternative embodiment;

FIG. 7A is a sectional end elevation view of a portion of the liquid distribution system as illustrated in FIG. 6A, configured to generate condensation in accordance with an alternative embodiment;

FIG. 7B is a sectional end elevation view of a portion of the liquid distribution system as illustrated in FIG. 7A, but configured to generate condensation in accordance with an alternative embodiment;

FIG. 8 is a top plan view of a porous floor of the data center illustrated in FIG. 1, constructed in accordance with one embodiment; and FIG. 9 is a side elevation view of a floor of the data center illustrated in FIG. 1, constructed in accordance with another embodiment.

DETAILED DESCRIPTION

Figure 1:
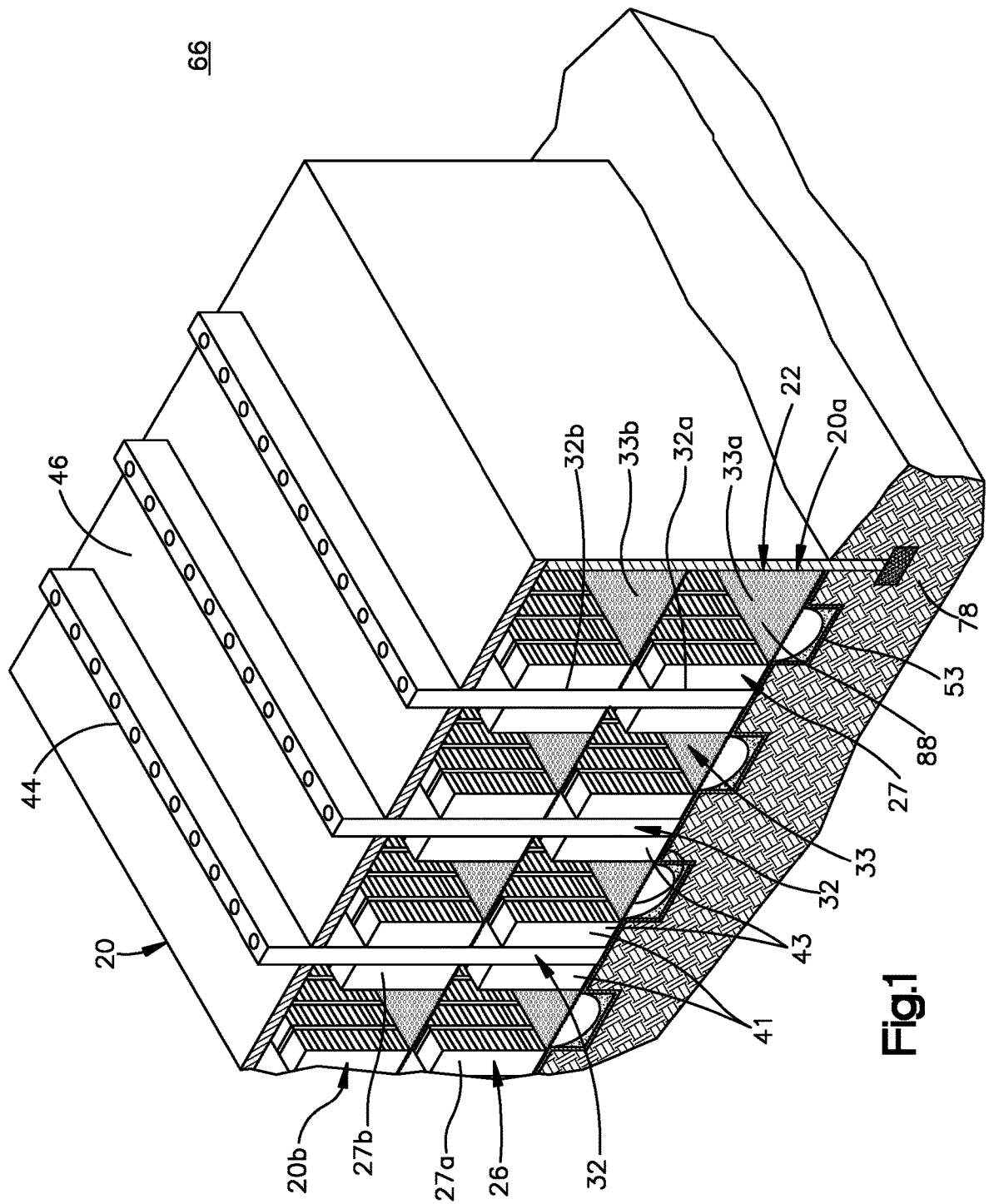
FIG. 1 is a schematic partial perspective view of a data center including a computing room, a plurality of rack systems disposed in the computing room and open to respective cold air aisles and hot air aisles, and a cooling system configured to deliver cold air to the cold air aisles, the cooling system including a liquid distribution system and an air movement system.

Systems and methods in accordance with various embodiments of the present disclosure provide the ability to remove heat from racks of computing devices of a data center. For example, in one embodiment, the data center includes at least one surface that can partially define a corresponding at least one conduit. The at least one surface is wetted with a liquid, and ambient air can be directed over the at least one surface such that heat is transferred from the ambient air to the liquid, thereby creating cold air from the ambient air. The cold air can then travels into cold air aisles to cool the computing devices.

According to one embodiment, the system can include conventional computing devices that do not require modification in order to facilitate removal of heat from the rack mounted computing devices.

Further still, according to one embodiment, the system does not occupy rack space that can otherwise be reserved for rack mounted computing devices.

As used herein, "data center" includes any facility or portion of a facility in which computer operations are carried out. A data center may include computing devices, including servers, dedicated to specific functions or serving multiple functions. Examples of computer operations include information processing, communications, testing, simulations, power distribution and control, and operational control.

As used herein, "computing room" refers to a room in a data center in which at least one rack resides. The room can be fully or partially defined by at least one computing room wall in the data center, or can be defined by an open space in a data center. The computing room wall can be disposed within the data center, or can be defined by an exterior wall of the data center.

As used herein, "cold air aisle" refers to a space in the data center that contains air to be passed through drawn into the computing devices such that heat from various components of the computing devices is transferred to the drawn air that has been passed therethrough;

As used herein, "hot air aisle" refers to a space in the data center that receives air that is exhausted from the computing devices;

As used herein, "rack housing" refers to a housing that at least partially defines an interior space within which at least one rack resides.

As used herein, "rack" means a rack, container, frame, bracket, plurality of brackets, or any other element or combination of elements that can contain or physically support one or more computing devices.

As used herein, "computing device" includes any of various devices in which computing operation or data storage can be performed. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In the various embodiments, memory may include, but is not limited to, a computer-readable medium, such as a random access memory (RAM). Alternatively or additionally, memory may include a compact disc-read only memory (CD-ROM), a magneto-optical disk (MOD), and/or a digital versatile disc (DVD). Also, additional input channels may include computer peripherals associated with an operator interface such as a mouse and a keyboard. Alternatively, other computer peripherals may also be used that may include, for example, a scanner. Further, in some embodiments, additional output channels may include an operator interface monitor and/or a printer.

Referring to FIGS. 1-3A, a data center 20 can include one or more computing rooms, such as a computing room 22, and a plurality of rack systems 26 that are disposed in the computing room 22. Each of the rack systems 26 define a row 27 of rack systems 26, such that the data center includes a plurality of rows 27 of rack systems 26 disposed in the computing room 22. At least some up to all of the rack systems 26 can include at least one or more racks 21 that include one or more rack housings 28 and that support a plurality of brackets. At least some up to all of the rack systems 26 can further include at least one computing device 34 such as a plurality of computing devices 34 supported by the brackets in the one or more rack housings 28.

Each of the rows 27 of rack systems 26 can be disposed between a hot air aisle 32 and a cold air aisle 33. Thus, it should be appreciated that the data center 20 can include a plurality of hot air aisles 32 and a plurality of cold air aisles 33. Furthermore, the data center 20 can include a plurality of rows 27 of rack systems 26 that are spaced from each other such that each of the plurality of rows 27 of rack systems 26 is disposed between a respective one of a plurality of hot air aisles 32 and a respective one of a plurality of cold air aisles 33. The rows 27 of rack systems 26 can be arranged so as to define at least one pair 41 of adjacent rows 27 of rack systems 26. For instance, the rows 27 of rack systems 26 can include at least one pair 41 of rows 27 of rack systems 26 whose computing devices 34 share a common one of the plurality of hot air aisles 32, the hot air is exhausted from such that the respective computing devices 34 of each of the rack systems 26 of the pair 41 exhaust hot air into the common one of the hot air aisles 32. For instance, in accordance with one embodiment, the respective computing devices 31 each of the rack systems 26 of the pair 41 can exhaust the hot air into the common one of the hot air aisles 32. Furthermore, the rows 27 of rack systems 26 can include at least one pair 43 of rows 27 of rack systems 26 whose computing devices 34 share a common one of the plurality of cold air aisles 33, such that the respective computing devices 34 of each of the rack systems 26 of the pair 43 receive cold air from the common one of the plurality of cold air aisles 33. In accordance with the illustrated embodiment, the rows 27 of the at least one pair 43 can be defined by one row 27 of a first one of the pairs 41 and one row 27 of a second one of the pairs 41. Otherwise stated, the at least one pair 41 of rows 27 of rack systems 26 can be defined by one row 27 of a first one of the pairs 43 and one row 27 of a second one of the pairs 43. It should be appreciated that the air inside the cold air aisle 33 has a temperature that is less than the temperature of the air in the hot air aisle 32 during operation of the computing devices 34.

Figure 2A:
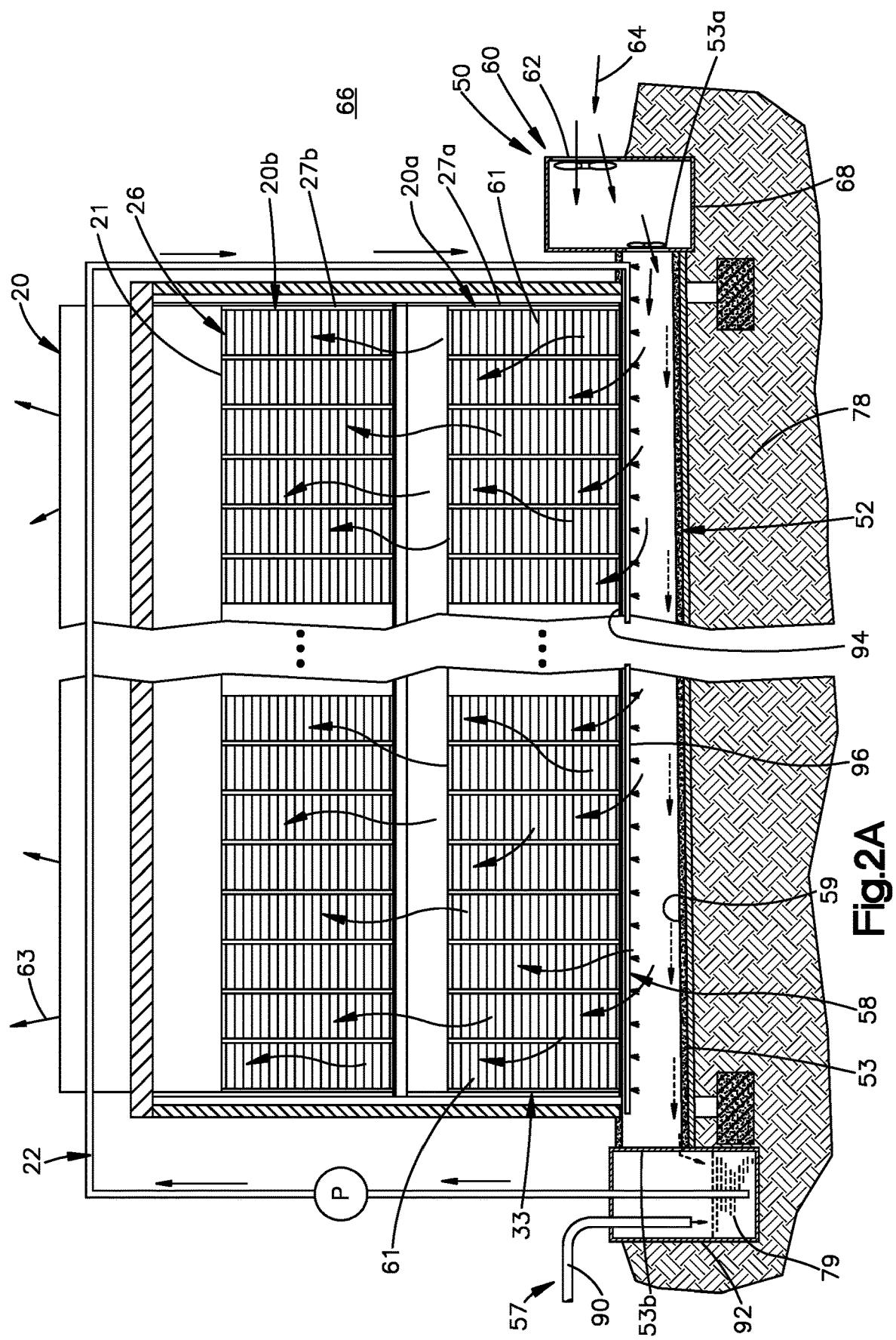
FIG. 2A is a sectional side elevation view of the data center illustrated in FIG. 1, showing airflow from the cooling system into the cold air aisles.
Figure 2B:
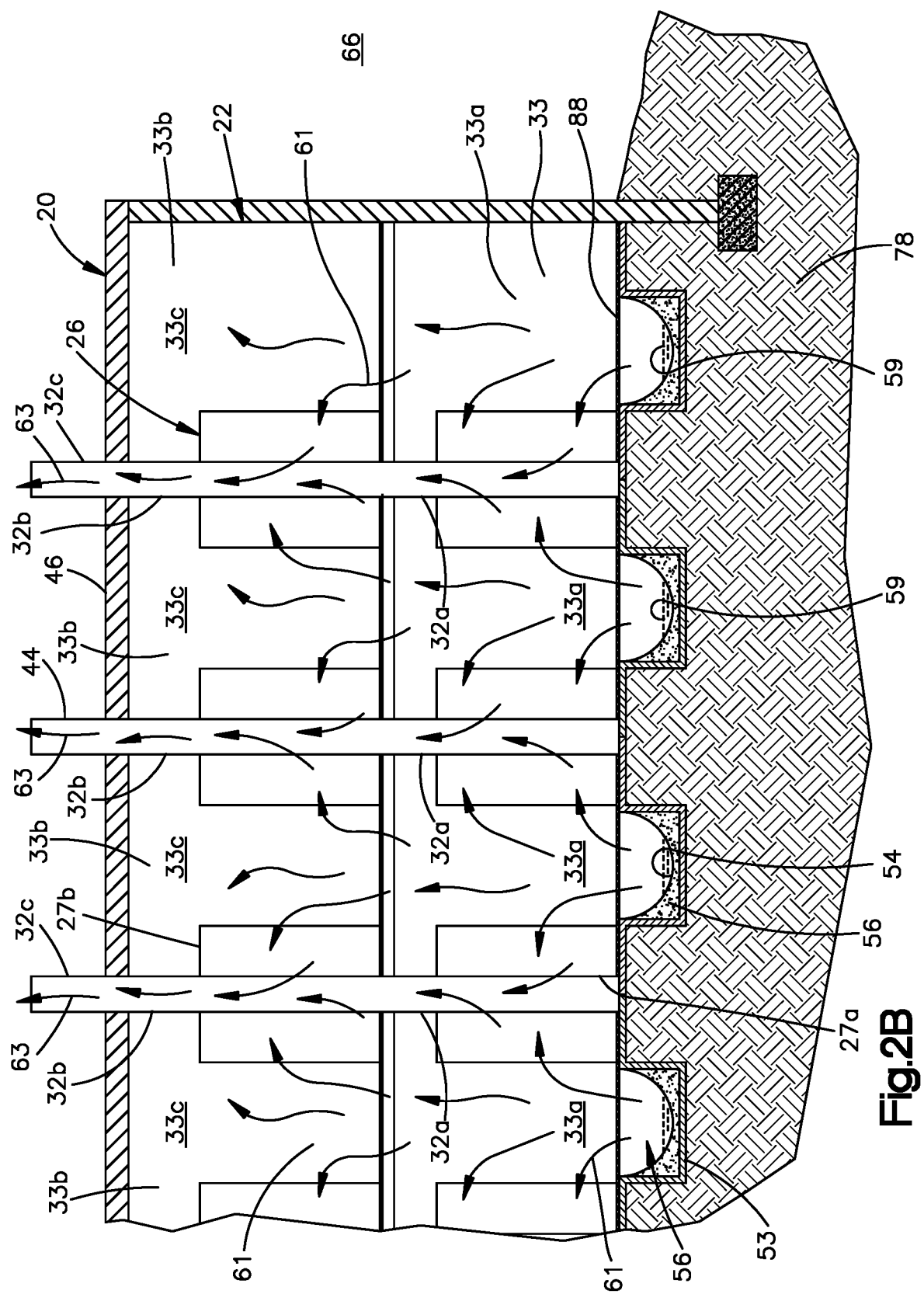
FIG. 2B is an enlarged sectional end elevation view of a portion of the data center illustrated in FIG. 2A.
Figure 3B:
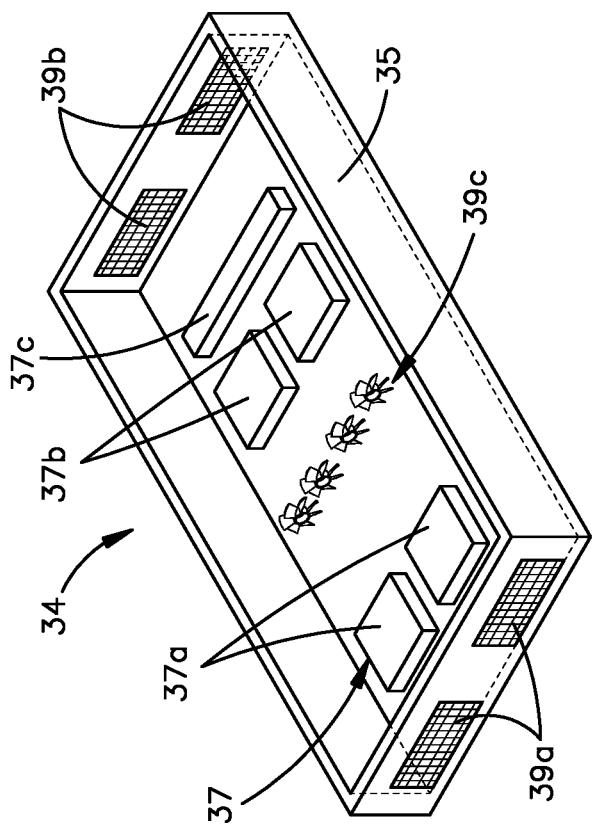
FIG. 3B is a schematic perspective view of one of the computing devices mounted to the rack as illustrated in FIG. 3A, with portions remove to illustrate various computing device components.
Figure 3A:
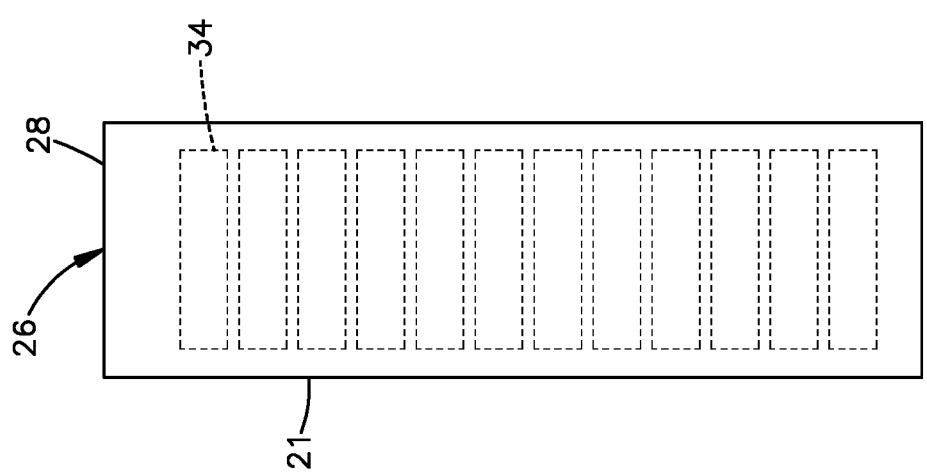
FIG. 3A is a front elevation view of one of the rack systems illustrated in FIG. 1 including a rack housing that defines an interior space, and a plurality of computing devices mounted to the rack.

Referring now to FIGS. 2B and 3B, each of the computing devices 34 can each include an outer housing 35 that contains a plurality of electrical components 37 of the computing device 34. For instance, electrical components 37 can include one or more hard drives 37a, processors 37b, and memory modules 37c. Each of the electrical components 37 can produce heat during operation of the computing device 34. The computing devices 34 can further include at least one air intake 39a that can be configured as a vent that extends through the housing 35, at least one air outlet 39b that can be configured as a vent that extends through the housing 35, and at least one fan such as a plurality of fans 39c that are configured to produce a negative pressure that draws cold air 61 from a respective one of the cold air aisles 33 to pass into through the air intake 39a, through the computing devices 34, and out the air outlets 39b. As the cold air 61 is received by the computing devices 34 and passes through the computing devices 34, heat is transferred to transfers heat to the drawn cold air 61 to produce hot air 63, which is exhausted and exhausts the produced hot air 63 through the air outlets 39b into a respective one of the hot air aisles 32. For instance, the received cold air 61 can flow over the electrical components 37 so as to transfer heat from the electrical components 27 to the received cold air 61, and the computing devices can exhaust the hot air out of the housing 35. The hot air 63 in the hot air aisles 32 is then expelled from the data center 20. For instance the hot air aisles 32 can define chimneys 44 that extend out from a roof 46 of the data center 20, as illustrated in FIG. 1. Thus, it should be appreciated that the computing devices 34 can be configured to draw the cold air 61 into the respective housing 35. Alternatively or additionally, the cold air 61 can be forced into the housing 35 without operating fans inside the housing 35 to induce a negative pressure within the housing 35. For instance, the cold air 61 in the cold air aisles 33 can be placed under a positive pressure that causes the cold air 61 to be drawn into the respective housings 35 of the computing devices 34, and pass through the computing devices 34.

Figure 2C:
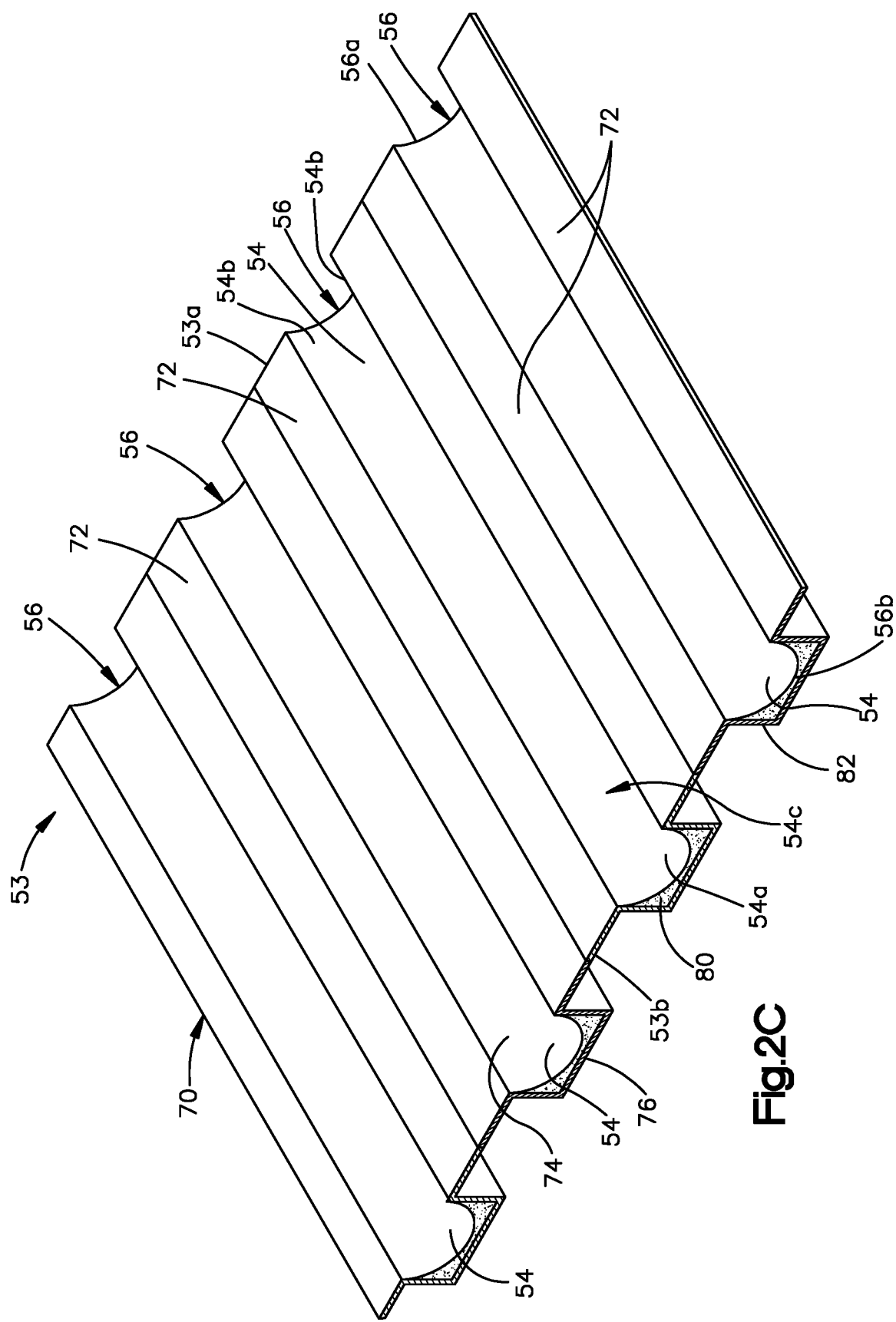
FIG. 2C is a liquid support member of the liquid distribution system illustrated in FIG. 1.

With continuing reference to FIGS. 1-2C, the data center 20 further includes a cooling system 50 that includes a liquid distribution system 52. The liquid distribution system 52 can include a liquid distribution member 53 that is configured to produce cold air 61 to be delivered to the plurality of computing devices 34 in the data center 20. The liquid distribution member 53 is elongate from a first end 53a to a second end 53b along its length, and defines at least one surface 54 which can, in turn, define a corresponding at least one conduit 56. For instance, a plurality of conduits 56 can be defined by respective surfaces 54, such that the conduits 56 are elongate along the length, which can also define the length of both the conduits 56 and the respective surfaces 54. For instance, the liquid distribution member 53, and thus the liquid distribution system 52 and the cooling system 50, can include a plurality of surfaces 54 that at least partially define a corresponding plurality of conduits 56 that are in fluid communication with a corresponding one of the plurality of cold air aisles 33. The liquid distribution system 52 can further include a liquid delivery system 57 that includes a plurality of liquid delivery members 58 that are in fluid communication with a corresponding at least one surface 54 of the liquid distribution member, such that each of the liquid distribution members 58 are configured to cause a liquid 59 to be delivered to a corresponding at least one surface 54 of the liquid distribution member 53 that is then wetted with the liquid 59. The liquid 59 can be delivered directly to the corresponding at least one surface 54 from the liquid distribution members 58, or the at least one surface 54 can be wetted by a condensate, which can for instance be defined by condensation on an outer surface of the liquid distribution members 58. Thus, the liquid distribution system 52 can include at least one liquid delivery member 58 configured cause the liquid 59 to be delivered to the at least one surface 54. The liquid 59 can be water or any suitable alternative liquid as desired. The at least one surface 54 is in fluid communication with, for instance aligned with, the cold air aisle 33.

The cooling system 50 can further include an air movement system 60 that is configured to draw source air 64 from any suitable source as desired and direct the source air 64 over the liquid 59 on the at least one surface 54 such that heat is transferred from the source air to the liquid 59, thereby producing cold air 61 from the source air. The cold air 61 travels from the wetted at least one surface to the cold air aisles 33. For instance, the air movement system 60, and thus the cooling system 50, can include at least one air mover 62, an in one embodiment a plurality of air movers 62, configured to the draw the source air 64 from the source. For instance, the source can be an ambient environment 66 in which the data center 20 is disposed. Thus, the source air 64 can be configured as ambient air that is drawn from the ambient environment 66 external to the data center 20 and into the data center 20. The air mover 62 is configured to direct the source air 64 over the liquid 59 on the at least one surface 54, for instance substantially parallel to the at least one surface 54, along a direction from the first end 53a to the second end 53b such that heat is transferred from the source air 64 to the liquid 59, thereby producing cold air 61 from the source air 64. Thus, the source air 64 does not travel from Because the conduits 56, and thus the at least one surface, 54 are open to the cold air aisles 33, the cold air can 61 flow from the wetted at least one surface 54, or the conduits 56, to the cold air aisles 33, such that the corresponding computing devices 34 draw the cold air in the manner described above. For instance, the air mover can direct the source air 64, which can be configured as ambient air, over the liquid 59 in the at least some of the plurality of conduits 56, along a direction substantially parallel to the at least some of the plurality of conduits 56, so as to produce the cold air 61 that flows into the plurality of cold air aisles 33 (see also FIG. 4). The air movement system 60 can further include a plenum 68 that is in fluid communication with the conduits 56, and thus with the at least one surface 54. Thus, the at least one air mover 62 can draw air into the plenum 68, which routes the source air 64 from the source to the conduits 56, and thus to the at least one surface 54. The plenum 68 can include filtration media that filters particulates from the source air 64 prior to directing the source air 64 into the conduits 56.

Referring now to FIG. 2C, the liquid distribution member 53 can include a frame 70, which can be a cast concrete frame, that includes the at least one surface 54 that, in turn, defines the plurality of open conduits 56 that are substantially parallel to each other. Thus, the plurality of conduits 56 can be monolithic with each other. As described above, the liquid distribution member 53, and thus the conduits 56 and the at least one surface 54, is elongate from a first end 53a of the liquid distribution member 53 to a second end 53b of the liquid distribution member 53. The at least one surface 54 can be a lower surface that is recessed with respect to an upper surface 72 of the frame 70. Thus, adjacent ones of the conduits 56 can be separated from each other by respective portions of the upper surface 72. The at least one surface 54, and thus each of the plurality of conduits 56, can include a base 54a and opposed sides 54b that extend from the first end 53a to the second end 53b. Each of the base 54a and the opposed sides 54b can define a first at least one surface 74 and a second at least one surface 76 that is opposite the first surface. In accordance with one embodiment, because the source air 64 can travel over the liquid 59 on the at least one surface 54, for instance substantially parallel to the at least one surface 54, along a direction from the first end 53a to the second end 53b, the source air 64 does not travel through the liquid distribution member 53 from the first at least one surface 74 to the second at least one surface 76.

The first at least one surface 74 can include the at least one surface 54. At least a portion of the frame 70, and thus at least a portion of the conduits 56, is configured to be buried under a ground 78 and open to the computing room 22. For instance, at least a portion of the conduits 56 can be disposed in troughs formed in the ground 78. The ground 78 can be defined by earth upon which the data center 20 is built (see FIGS. 1-2B), such that the first at least one surface 74 faces away from the ground and defines the open conduits 56. For instance, the open conduits 56 can define an open upper end 54c that faces and is open to the computing room 22. In accordance with one embodiment, the frame 70 can be pre-cast prior to being inserted into the ground 78. When the frame 70 is at least partially buried under the ground 78 and the first at least one surface 74 is wetted with the liquid 59, such as water, the frame 70 facilitates heat transfer from the liquid to the ground 78. When the source air 64, which can be ambient air, is directed to travel along the open conduits 56 in a direction from the first end 56a toward the second end 56b over the liquid 59, heat is transferred from the source air 64 to the liquid 59 so as to produce the cold air 61. It should be appreciated that at least one up to all of the conduits 56 can alternatively be separate at least one up to all of the other conduits 56, and not connected by a common frame 70. It should be appreciated that the conduits can be defined by any structure as such as a tube having an inner surface that is configured to be wetted by the liquid 59, and having openings that are in fluid communication with, for instance aligned with, the cold air aisles 33, such that the source air 64 that flows into the tube exits through the openings and travels to the cold air aisles 33 in the manner described above. Thus, the plurality of conduits 56 can be aligned with at least respective ones of the plurality of cold air aisles 33 that are configured to deliver cold air to respective pluralities of the computing devices 34.

As illustrated in FIGS. 5A-B, the conduits 56 can define any suitable size and shape as desired. The conduits 56 can define a width along a direction that is perpendicular to the length of the liquid distribution member 53. The width is measured from one of the sides 54b to the other of the sides 54b. The conduits can further define a depth along a direction that is perpendicular to both the length and the width. The depth is measured from the base 54a to the open upper end 54c. As illustrated in FIG. 5A, the depth can be greater than the width. Alternatively, as illustrated in FIG. 5B, the width can be greater than the depth. Alternatively still, the depth can be equal to the width. At least some of the conduits 56 up to all of the conduits 56 can have a width of between three and fifteen feet, for instance between four and ten feet, and a depth of between three and fifteen feet, for instance between four and ten feet.

The first at least one surface 74, in cross section along a plane that is normal to the length of the liquid distribution member 53, can be concave and rounded or alternatively shaped. In accordance with one embodiment, the sides 54b can be continuously curved with the base 54a. The second at least one surface 76 can be rectangular in cross-section along a plane that is normal to the length of the conduits 56, or define any suitable alternative shape in cross-section as desired. As illustrated in FIGS. 5A-5B, the frame 70 can include a first material 80 that defines the first at least one surface 74, and a second material 82 that defines the second at least one surface 76. Alternatively, as illustrated in FIG. 5C, the frame 70 can define a single material 84, which can be a single concrete material, that defines both the first at least one surface 74 and the second at least one surface 76. The liquid distribution member 53 can further include a water impermeable liner that extends over the second at least one surface 76.

Referring to FIGS. 1-2B, The liquid delivery system 57 can include a liquid source 90 and a reservoir 92 that receives a liquid 79 from the liquid source 90. The liquid 79 can be flow through, and for instance can be circulated, through the liquid delivery member 58 in accordance with any suitable embodiment. In accordance with one embodiment, the liquid delivery system 57 can be an open or closed system. For example, the The liquid source 90 can be configured as a faucet that is connected to the building plumbing so as to deliver the liquid 79 in the form of water to the reservoir 92. The liquid 79 can be pumped to the liquid delivery member 58 that delivers the liquid 79 to the at least one surface 54. For instance, the liquid delivery member 58 can be configured as piping 96 or any suitable alternative structure that can include a passageway, that extends along at least a portion of the liquid distribution member 53, and carries the liquid 79 so as to cause the liquid 56 to be delivered to the at least one surface. For instance, in accordance with one embodiment, the liquid delivery member 58 can deliver the liquid 79 to the at least one surface 54, such that the liquid 79 of the liquid delivery system 57 is the liquid 59 that is disposed on the at least one surface 54. Thus, the reservoir 92 can receive the liquid 59 from the liquid source 90. The liquid 79 can be referred to as a first liquid, and the liquid 59 can be referred to as a second liquid, at least a portion up to all of which can be the same or different than the first liquid 79.

In accordance with one embodiment, the liquid delivery member 58 can include one or more ports 94, which can be configured as spigots or any suitable alternatively constructed outlets, that deliver the liquid 59 to the at least one surface 54. For instance, the ports 94 can be spaced from each other along the length of the at least one surface 54 or conduit 56. The at least one surface 54 can be sloped downward along a direction from the first end 53a to the second end 53b. Accordingly, excess amounts of the liquid 59 that collect on the at least one surface 54 can flow along the at least one surface 54 in a direction from the first end 53a to the second end 53b under gravitational forces and drain into the reservoir 92. Thus, it should be appreciated that the second end 53b can be in fluid communication with the reservoir 92.

The reservoir 92 can be configured to remove heat from the contained liquid 59 as desired. Alternatively or additionally, the water delivered to the reservoir 92 from the liquid source 90 can be of a temperature suitably low to remove heat from the liquid 59 that enters the reservoir 92 from the conduits 56. Each of the conduits 56 can be in fluid communication with the same reservoir 92, or the liquid distribution system 52 can include a reservoir 92 dedicated to one or more of the conduits 56. While the liquid delivery system 57 has been described in accordance with one embodiment, it should be appreciated that any suitable liquid delivery system 57 configured to deliver a liquid 59 to the at least one surface 54 suitable to remove heat from the air that travels along the at least one surface 54 can be implemented. The liquid distribution system 52 can further include controls that increase or decrease the flow rate of the liquid 59 to the at least one surface 54, for instance, based on a sensed volume of liquid 59 at the at least one surface 54. Various embodiments of the liquid distribution system 52 will now be described with reference to FIGS. 6A-6G. The liquid distribution system 52 can further include controls that increase or decrease the flow rate of the source air 64 based on a sensed temperature of one or more of the cold air aisles 33 and computing devices 34.

Referring to FIGS. 2A and 6A, as described above, the frame 70 can include at least one material, such as the first material 80 that defines the first at least one surface 74 and the second material 82 that defines the second at least one surface 76. The second material 82 can be less permeable with respect to the liquid, such as water, than the first material 80. Each of the first and second materials 80 and 82 can be concrete, or any suitable alternative material as desired. The second material 82 can be substantially impervious to water, meaning that the liquid distribution system 52 is able to maintain a sufficient amount of the liquid 59 at the at least one surface 54 so as to remove heat from the source air 64 as it travels along the at least one surface 54 to produce cold air that is sufficiently cold to remove an adequate amount of heat from the computing devices 34 during operation. The first material 80 can be porous with respect to the liquid 59. As described above, the liquid delivery member 58 can be configured as piping 96 or any suitable alternative structure that can include a passageway that extends along at least a portion of the liquid distribution member 53 so as to deliver the liquid 59 to the at least surface 54. The liquid delivery member 58 can be substantially centrally disposed with respect to the width of the frame 70. For instance, the liquid delivery member 58, such as the piping 96, can include the port 94 that delivers the liquid 59 to the at least one surface 54. The liquid delivery member 58 can be supported above at least a portion of the at least one surface 54 such that the liquid 59 is sprayed from the liquid delivery member 58 through air to the at least one surface 54. At least a portion up to an entirety of the at least one surface 54 can be concave with respect to the liquid delivery member 58.

Alternatively, referring to FIG. 6B, the frame 70 can include a single material 84 that defines both the first at least one surface 74 and the second at least one surface 76. The single material 84 can be substantially impermeable with respect to the liquid, and in particular water. In accordance with one embodiment, the single material 84 is concrete, though it is envisioned that the first and second materials 80 and 82 and the single material 84 can be made of any suitable alternative material as desired. As illustrated in FIG. 6B, the liquid delivery member 58 can be suspended above the at least one surface 54 as described above with respect to FIG. 6A. It should be appreciated that the liquid distribution system 52 can include any number of liquid delivery members 58 as desired. For instance, as illustrated in FIG. 6C, the liquid distribution system 52 can include a first liquid delivery member 58 adjacent to a first one of the sides 54b, and a second liquid delivery member 58 adjacent to a second one of the sides 54b.

Figure 6D:
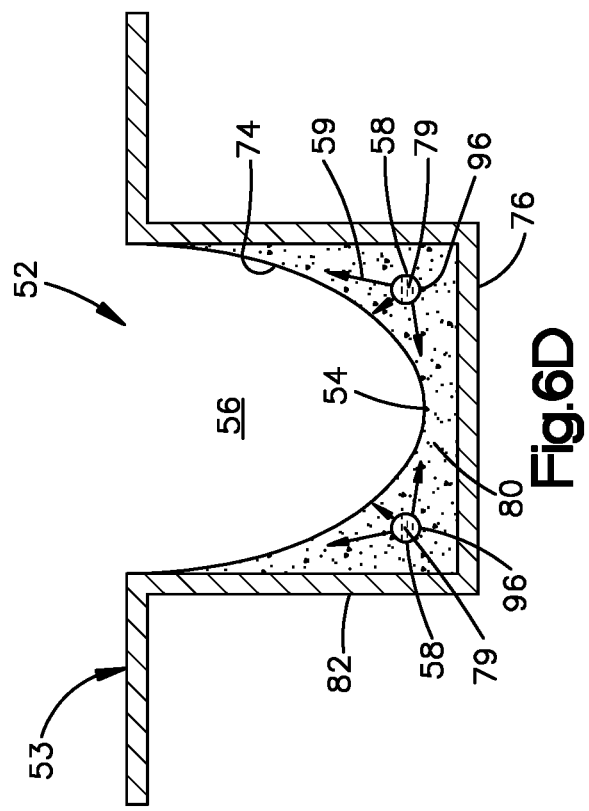
FIG. 6D is a sectional end elevation view of a portion of the liquid distribution system as illustrated in FIG. 6A, but constructed in accordance with an alternative embodiment.
Figure 6E:
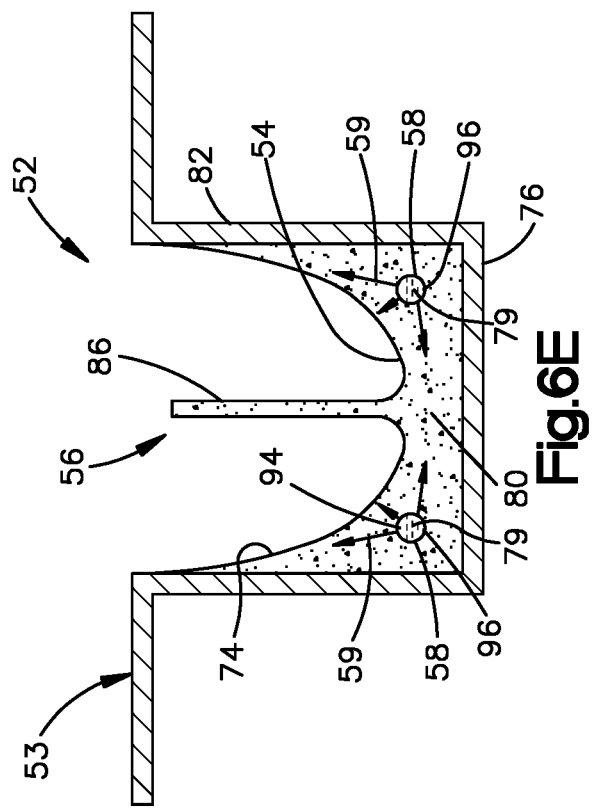
FIG. 6E is a sectional end elevation view of a portion of the liquid distribution system as illustrated in FIG. 6A, but constructed in accordance with an alternative embodiment.
Figure 6F:
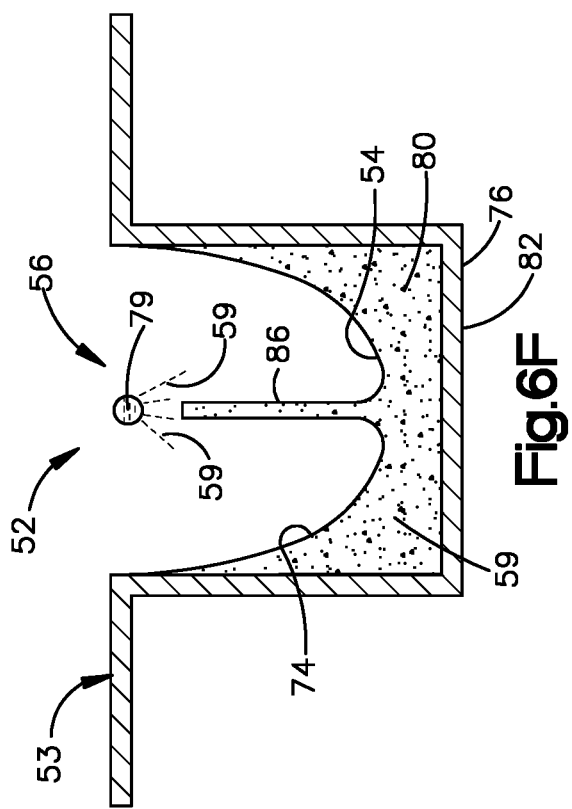
FIG. 6F is a sectional end elevation view of a portion of the liquid distribution system as illustrated in FIG. 6A, but constructed in accordance with an alternative embodiment.
Figure 6G:
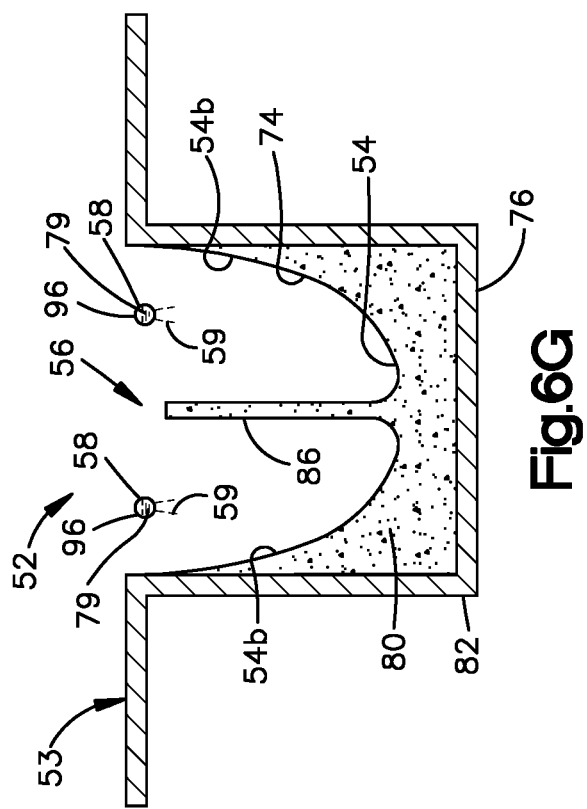
FIG. 6G is a sectional end elevation view of a portion of the liquid distribution system as illustrated in FIG. 6A, but constructed in accordance with an alternative embodiment.

Referring now to FIG. 6D, alternatively or additionally, the liquid distribution member 53, and thus the liquid distribution system 52, can include the liquid delivery member 58 which can be configured as piping that is at least partially embedded in the frame 70, for instance fully embedded in the frame 70, between the first at least one surface 74 and the second at least one surface 76. The liquid delivery member 58 can have define one or more ports 94 that deliver the liquid between the first and second at least one surfaces 74 and 76 in a material, which can be the first material 80 or the single material 84, such that the liquid 59 travels through the material to the at least one surface 54. Thus, at least a portion of the liquid delivery member 58 can be embedded in a porous material, and configured to deliver liquid that travels at least a portion of the frame 70, for instance through the porous material, to the at least one surface 54. Because the second material 82 is substantially impermeable with respect to the liquid 59, a majority of the liquid 59 travels to the at least one surface 54 with respect to an amount of liquid that travels to the ground 78. It should further be appreciated that the single material 84 can be permeable with respect to the liquid 59, and the liquid distribution member 53 can include a liner that is substantially water impermeable and covers the second at least one surface 76. As illustrated in FIG. 6D, the liquid distribution member 53, and thus the liquid distribution system 52, can include a first liquid delivery member 58 at least partially embedded in the frame 70 adjacent a first one of the sides 54b, and a second liquid delivery member 58 at least partially embedded in the frame 70 adjacent a second one of the sides 54b, Referring now to FIG. 6E, the at least one surface 54, and thus the liquid distribution member 53, can define at least one fin 86 such as a plurality of fins 86 that increase the surface area of the at least one surface 54. For instance, the fin 86 can extend along a direction from the base 54a toward the upper surface 72. The first material 80 can be sufficiently porous such the liquid travels from at least one liquid delivery member 58 through the first material 80 to a portion of the at least one surface 54 that is defined by the fin 86. Alternatively or additionally, referring to FIGS. 6F-6G, the liquid delivery member 58 can be supported above the fin 86 and configured to spray a portion of the at least one surface 54, including the portion of the at least one surface 54 defined by the fin 86. For instance, as illustrated in FIG. 6F, the liquid delivery member 58 can be inline with the fin 86. Alternatively or additionally, as illustrated in FIG. 6G, first and second liquid delivery members 58 can be disposed on opposed sides of the fin 86, such that the first liquid delivery member 58 directs a spray to a first side of the fin 86, and the second liquid delivery member 58 directs a spray to a second side of the fin 86 that is opposite the first side of the fin 86. The fin 86 can be defined by the first material 80, for instance, when the frame 70 includes the first and second materials 80 and 82, respectively. Alternatively, the fin 86 can be defined by the single material 84, for instance when the frame 70 includes only the single material 84 that defines the first and second at least one sides 74 and 76, respectively, as illustrated in FIGS. 6B-6C. It should be appreciated that one or more liquid delivery members can be embedded in the frame, and one or more liquid delivery members can be supported above the at least one surface 54.

As described above, the liquid delivery system 57 is configured to deliver the liquid 59 to the at least one surface 54. Thus, the liquid delivery system 57 can cause the liquid 59 to be delivered into the plurality of conduits to the at least one surface 54. For instance, the liquid delivery system is configured to deliver the liquid 79 to the at least one surface 54, such that the liquid 79 of the liquid delivery system 57 is the liquid 59 that is disposed on the at least one surface 54. Alternatively, referring generally in FIGS. 7A-7B, the liquid 59 can be a different liquid than the liquid 79 that is carried by the liquid delivery member 58. For example, the liquid 59 can be induced by the liquid 79 of the liquid delivery system 57 such that the liquid 59 is delivered to the at least one surface 54 by the liquid delivery system 57. In accordance with one embodiment, the liquid delivery member 58 can be enclosed so as to carry the liquid 79 in the manner described above. The liquid 79 can have a temperature less than the dew point of surrounding air 83, that is the air that surrounds the liquid delivery member 58. The liquid delivery member 58 can be sufficiently thermally conductive such that an outer surface of the liquid delivery member 58 is likewise below the dew point of the surrounding air, so as to generate condensation 81 outside the liquid delivery member 58. The condensation 81 can thus define the liquid 59 that is delivered to the at least one surface 54. Thus, the liquid delivery system 57 can cause the liquid 59 to be delivered into the plurality of conduits 56, for instance to the at least one surface 54.

As illustrated in FIG. 7A, the liquid delivery member 58 which can be configured as piping can be at least partially embedded in the frame 70, for instance fully embedded in the frame 70, between the first at least one surface 74 and the second at least one surface 76, for instance as described above with reference to FIGS. 6D and 6E. The frame 70, the liquid 79, or a combination of both can be of a temperature sufficient to cool the liquid delivery member 58 below the dew point of the surrounding air 83. The surrounding air 83 can reside in the pores disposed between the first and second at least one surfaces 74 and 76 in the first material 80 or the single material 84, such that the condensation 81 travels through the material to the at least one surface 54. Thus, the liquid 59 can be induced by the liquid 79 carried by the liquid delivery member 58 that is embedded in a porous material, such that the liquid 59 is delivered to the at least one surface 54 by the liquid delivery system 57. Because the second material 82 can be substantially impermeable with respect to the condensation 81, a majority of the condensation 81 travels to the at least one surface 54 with respect to an amount of liquid that travels to the ground 78. It should further be appreciated that the single material 84 can be permeable with respect to the condensation 81, and the liquid distribution member 53 can include a liner that is substantially water impermeable and covers the second at least one surface 76. As illustrated in FIG. 7A, the liquid distribution member 53, and thus the liquid distribution system 52, can include a first liquid delivery member 58 at least partially embedded in the frame 70 adjacent a first one of the sides 54b, and a second liquid delivery member 58 at least partially embedded in the frame 70 adjacent a second one of the sides 54b, each liquid delivery member 58 configured to generate condensation outside the liquid delivery member 58. The at least one surface 54 of FIG. 7A can further define at least one fin 86 as described above with respect to FIG. 6E.

Referring now to FIG. 7B, and as described above, the frame 70 can include a single material 84 that defines both the first at least one surface 74 and the second at least one surface 76. The single material 84 can be substantially impermeable with respect to the liquid, and in particular water. In accordance with one embodiment, the single material 84 is concrete. Alternatively, as illustrated in FIG. 6A, the frame 70 can include the first material 80 that defines the first at least one surface 74 and the second material 82 that defines the second at least one surface 76. The second material 82 can be less permeable with respect to the liquid, such as water, than the first material 80. Each of the first and second materials 80 and 82 can be concrete, or any suitable alternative material as desired. The second material 82 can be substantially impervious to condensation 81, such as water, meaning that the liquid distribution system 52 is able to maintain a sufficient amount of the liquid 59 at the at least one surface 54 so as to remove heat from the source air 64 as it travels along the at least one surface 54 to produce cold air that is sufficiently cold to remove an adequate amount of heat from the computing devices 34 during operation. The first material 80 can be porous with respect to the liquid 59.

The liquid delivery member 58 can be supported, for instance suspended, above at least a portion of the at least one surface 54, and the liquid 79 can be of a temperature sufficient to bring the temperature of the outer surface of the liquid delivery member 58 to a temperature below the dew point of the surrounding air 83. Because the liquid delivery member 58 is suspended above at least a portion of the at least one surface 54, the surrounding air 83 can be defined by the source air 64, such that the condensation 81 formed on the outer surface of the liquid deliver member 58 travels from the liquid delivery member 58 to the at least one surface 54 under gravitational forces, for instance in the form of droplets. It should be appreciated that the liquid distribution system 52 can include any number of liquid delivery members 58 as desired. For instance, as illustrated in FIG. 6C, the liquid distribution system 52 can include a first liquid delivery member 58 adjacent to a first one of the sides 54b, and a second liquid delivery member 58 adjacent to a second one of the sides 54b. It should be appreciated the at least one liquid delivery member 58 can be configured to generate the condensation 81 in the manner described above so as to define at least a portion of the liquid 59, and can alternative or additionally define at least one port 94 (see, e.g., FIG. 6A) so as to deliver the liquid 79 carried by the liquid delivery member 58 to the at least one surface 54 in the form of at least a portion of the liquid 59.

Referring again to FIGS. 1-2B, the data center 20 includes a porous floor 88 disposed in the computing room 22 between the plurality of cold air aisles 33 and the frame 70, and thus between the cold air aisles 33 and the at least one surface 54 and plurality of conduits 56. The porous floor 88 can cover the open upper ends 54c of the conduits 56, and can for instance be supported by the upper surface 72 of the frame 70 (see FIG. 4). Thus, the cold air 61 flows from the plurality of conduits 56, through the porous floor 88, and into the plurality of cold air aisles 33. At least some of the rack systems 26, and in particular the respective rack housings 28, can be supported on the porous floor 88. The porous floor 88 defines a first end 88a and a second end 88b opposite the first end 88a and spaced from the first end along the direction of source air flow from the first end 53a of the liquid distribution member 53 is to the second end 53b. Thus, the porous floor 88 defines a length from the first end 88a to the second end 88b. The first end 88a of the porous floor 88 can be disposed adjacent the first end 53a, and the second end 88b can be disposed adjacent the second end 53b.

As described, at least a portion of the frame 70, and thus at least a portion of the conduits 56, is configured to be disposed under the ground 78 and open to the computing room 22. For instance, at least a portion of the conduits 56 can be disposed in troughs formed in the ground 78. Thus, while it is envisioned that the temperature of the ground 78 can facilitate heat transfer from either or both of the source air and the liquid 59 into the ground, other modes of heat transfer from either or both of the source air and the liquid 59 can be provided such that the at least a portion of the frame 70, and thus the at least a portion of the conduits 56, can be disposed below the porous floor 88 without being buried or otherwise disposed under ground.

Referring now to FIGS. 7-8, in order to allow distribute adequate airflow to the cold air aisles 33 along the length of the liquid distribution member 53, the porous floor 88 has a porosity that varies over the length of the porous floor 88.

For instance, the porosity can increase along a direction from the first end 88a toward the second end 88b. Thus, the porosity increases along a direction of travel of the source air 64 along the at least one surface 54. For instance, as illustrated in FIG. 7, a plurality of apertures 98 can extend through the porous floor 88. The porous floor 88 can define a density of apertures 98 that increases along a direction from the first end 88a toward the second end 88b. Alternatively or additionally, as illustrated in FIG. 8, the data center 20 can include a plurality of louvers 100 that can be adjustable so as to vary an area of the apertures 98 that is exposed to facilitate airflow through the apertures 98. The louvers 100 can be positioned such that the area of the apertures 98 that is exposed increases along the direction from the first end 88a toward the second end 88b. It should be appreciated that the data center 20 can include any suitable alternative apparatus configured to deliver the cold air 61 to the cold air aisles 33.

Referring again to FIGS. 1-2B, it is envisioned that the data center 20, and in particular the computing room 22, can define multiple levels stacked vertically over each other. For instance, the data center can include a first level 20a that defines a lower level, and a second level 20b that defines an upper level disposed above the first level 20a. Thus, the at least one row 27 or plurality of rows 27 of rack systems 26 can define a first row 27a or first plurality of rows 27a of rack systems 26 supported at a first level 20a of the data center. The porous floor 88 can separate the first level 20a from the liquid distribution member 53, such that the rack systems 26 of the first row 27a are supported by the porous floor 88, either directly or indirectly. Further, the hot air aisles 32, which can be sealed from the cold air aisles 33 and the flow of cold air 61 from the liquid distribution member 53, can define first hot air aisles 32a disposed at the first level 20a, the cold air aisles 33 can define first cold air aisles 33a disposed at the first level 20a, and the computing devices 34 can define are a first plurality of computing devices 34a disposed at the first level 20a.

The data center 20 can include a second row 27b of rack systems 26 disposed in the computing room 22 at the second level 20b. Each of the second rows 27b of rack systems 26 can be disposed between a respective second hot air aisle 32b of a second plurality of hot air aisles 32b, and a second cold air aisle 33b of a plurality of second cold air aisles 33b. Thus, the second hot air aisles 32b and the second cold air aisles 33b are disposed at the second level. The second row 27b of rack systems 26 can include at least one or more racks 21 that include one or more rack housings 28 and that support a plurality of brackets. At least some up to all of the rack systems 26 of the second row 27b of rack systems can further include at least one second computing device 34b such as a second plurality of computing devices 34b supported by the brackets in the one or more rack housings 28 of the second row 27b, and thus mounted to the rack housings 28 of the second row 27b of rack systems 26. Thus, the cold air 61 travels from the at least one surface 54, and thus from the respective at least one conduit 56, to the second cold air aisles 33b, such that the computing devices 34 of the second plurality of computing devices draw the cold air 61 from the second cold air aisle 33b, transfer heat to the drawn cold air 61 in the manner described above so as to produce hot air 63, and exhaust the produced hot air 63 into the second hot air aisle 32b.

For instance, the first and second cold air aisles 33a and 33b can be arranged such that a portion of the cold air 61 travels from the at least one surface 54 to the first cold air aisle 33a and into the computing devices 34 of the first plurality of the computing devices 34a, and another portion of the cold air 61 travels through the first cold air aisle 33a to the second cold air aisle 33b, and into the computing devices 34 of the second plurality of computing devices 34b. For instance, the first and second cold air aisles 33a and 33b can be inline with each other so as to define a cold air column 33c that is open to the at least one surface 54 and extends through the first level 20a to the second level 20b of the data center 20. Similarly, the first and second hot air aisles 32a and 32b can be inline with each other so as to define a hot air column 32c that extends through the first level 20a to the second level 20b of the data center 20, and out the data center 20 into the ambient environment 66, such that the hot air 63 exhausted by the first plurality of computing devices 34a travels from the first hot air aisle 32a to the second hot air aisle 32b through the hot air column 32c and is expelled out the data center 20. Alternatively, the first and second cold air aisles 33a and 33b can be offset from each other, such that cold air such that a portion of the cold air 61 travels from the at least one surface 54 to the first cold air aisle 33a and into the computing devices 34 of the first plurality of computing devices 34a, and another portion of the cold air 61 can be routed laterally from the first cold air aisle and through a second cold air aisle 33b that is not aligned with the first cold air aisle 33a along the vertical direction, and subsequently drawn through the respective computing devices 34 of the second row 27b. Similarly, the first and second hot air aisles 32a and 32b can be offset from each other. The hot air column 32c, or the second hot air aisles 32b, can define the chimneys 44 that extend out from the roof 46 of the data center 20.

Referring now to FIGS. 1-8 generally, it should be appreciated that a method can be provided for removing heat from the computing devices 34 of the data center 20. The method can include a first step of introducing the liquid 59 onto the at least one surface 54. The introducing step can comprise the step of circulating liquid in the liquid delivery member that is delivered directly to the at least one surface 54. For instance, the directly delivered liquid can travel through pores of the frame 70 to the at least one surface, or can be sprayed onto the at least one surface 54. The introducing step can additionally or alternatively include the step of inducing the liquid to be delivered to the at least one surface 54, for instance through the pores or under gravitational forces to the at least one surface 54. The step of inducing can include the step of generating condensation, such that the induced liquid is the condensate 81. The method can include a second step of directing the source air 64 to flow over the at least one surface 54 so as to produce the cold air 61 that flows toward the computing devices 34. The method can include a third step of causing the cold air 61 to be drawn into the computing devices 34 and, after the causing step, transferring heat from the computing devices 34 the cold air 61 so as to produce the hot air 63. The method can include a fourth step of exhausting the hot air 63 out the computing devices 34. The introducing step can further include spraying the liquid 59 onto the at least one surface 54. The at least one surface 54 can be defined by a porous material, and the introducing step can alternatively or additionally include the step of wetting the porous material from the liquid distribution member 53 that is at least partially embedded in the porous material, such that the liquid 59 travels to the at least one surface 54. The directing step can further include the step of ambient air from the ambient environment 66 outside the data center 20 to flow over the at least one surface 54. The method can further include the step of expelling the hot air 63 out the data center 20. At least a portion of the at least one surface 54 can be buried or otherwise disposed under the ground 78, and the method can further include the step of transferring heat from the ground 78 to the liquid 59 that is on the at least one surface 54 so as to cool the liquid 59 that is on the at least one surface 54.

It is recognized that while the cooling system 50 can be configured to deliver cold air to a data center, the cooling system 50 as described above can be configured to deliver cold air to an internal environment any suitable building structure as desired. The internal environment can be configured as a computing room as described above, or any suitable alternatively constructed internal environment, for instance a residential or commercial internal environment. Thus, the cooling system 50 an include the at least one surface 54 that is wetted with the liquid 59 in any manner as described above, and in fluid communication with the internal environment. For instance, air can be forcibly fed under pressure to the internal environment, or can be disposed in alignment with the internal environment in the manner described above. In this regard, it should be appreciated that the at least one surface 54 of the liquid distribution member 53 can be partially or entirely located external to the building structure, but nonetheless be considered to be included in the building. Thus, the air mover 62 can be configured to direct the source air 64 over the liquid substantially parallel to the at least one surface 54 so as to produce the cold air 61 that flows from the at least one surface 54 to the internal environment. The cold air 61 passes through the internal environment, such that the internal environment transfers heat to the cold air 61 so as to produce hot air, and the hot air is exhausted out the internal environment. For instance, the hot air can be exhausted out the building. The building thus can further include the liquid delivery system 57 that includes at least one liquid delivery member 58 that is in fluid communication with a corresponding at least one surface 54 of the liquid distribution member, such that each of the liquid distribution members 58 are configured to cause a liquid 59 to be delivered to a corresponding at least one surface 54 of the liquid distribution member 53 that is then wetted with the liquid 59 as described above. For instance, the liquid delivery member 58 can be maintained at a temperature below the dew point of the surrounding air so as to generate condensation that is disposed on the at least one surface 54 in the manner described above.

It should be noted that the illustrations and discussions of the embodiments shown in the figures are for exemplary purposes only, and should not be construed limiting the disclosure. One skilled in the art will appreciate that the present disclosure contemplates various embodiments. Additionally, it should be understood that the concepts described above with the above-described embodiments may be employed alone or in combination with any of the other embodiments described above. It should further be appreciated that the various alternative embodiments described above with respect to one illustrated embodiment can apply to all embodiments as described herein, unless otherwise indicated.

What is claimed:

1. A liquid distribution system configured to produce cold air to be delivered to a plurality of computing devices in a data center, the liquid distribution system comprising:
    a frame that defines a plurality of open conduits that are substantially parallel to each other, the frame configured to be at least partially buried under a ground such that a first at least one surface faces away from the ground and defines the open conduits, and a second at least one surface opposite the first at least one surface,
    wherein when the frame is at least partially buried under ground and the first at least one surface is wetted with a liquid, the frame facilitates heat transfer from the liquid to the ground, and when ambient air directed to travel along the open conduits over the liquid, heat is transferred from the ambient air to the liquid so as to produce cold air.

2. The liquid distribution system of claim 1, wherein the frame comprises a first material that defines the first at least one surface, a second material that defines the second at least one surface, and the second material is less permeable with respect to the liquid than the first material.

3. The liquid distribution system of claim 2, wherein the first material is porous such that the liquid travels through the first material to the first at least one surface.

4. The liquid distribution system of claim 1, wherein the frame comprises a single concrete material that defines both the first and second at least one surfaces, and the single concrete material is substantially impermeable with respect to the liquid.

5. The liquid distribution system of claim 1, wherein the first and second at least one surfaces are defined by a concrete material that is permeable to the liquid, the liquid distribution system further comprising a liquid impermeable liner that extends over the second at least one surface.

6. The liquid distribution system of claim 1, further comprising piping at least partially embedded in the frame, the piping having ports configured to deliver the liquid to the frame, such that the liquid travels through at least a portion of the frame to the first at least one surface.

7. The liquid distribution system of claim 1, further comprising at least one liquid delivery member that is maintained at a temperature below a dew point of ambient air so as to generate condensation that is disposed on the first at least one surface to define the liquid.

8. The liquid distribution system of claim 2, wherein the at least one liquid delivery member is embedded between the first at least one surface and the second at least one surface.

9. The liquid distribution system of claim 1, wherein the plurality of open conduits are in fluid communication with a plurality of cold air aisles that are configured to deliver the cold air to a respective plurality of computing devices.

10. The liquid distribution system of claim 1, wherein the first at least one surface defines at least one fin so as to increase a surface area of the first at least one surface, and the at least one fin is defined by a same material as one that defines the first at least one surface.

11. The liquid distribution system of claim 1, wherein the first at least one surface of each of the open conduits is concave and rounded.

12. The liquid distribution system of claim 1, wherein at least some of the conduits has a width of between three and fifteen feet, and a depth of between three and fifteen feet.

13. A liquid distribution system of producing cold air in a data center, the liquid distribution system comprising:
    at least one conduit in fluid communication with an internal environment of the data center;
    wherein the at least one conduit comprises at least one surface that is wetted with a liquid, and heat is transferred from source air to the liquid so as to produce cold air when the source air is directed to travel over the liquid substantially parallel to the at least one surface.

14. The liquid distribution system of claim 13, further comprising at least one liquid delivery member that is maintained at a temperature below a dew point of surrounding air so as to generate condensation that is disposed on the at least one surface to define the liquid.

15. The liquid distribution system of claim 14, wherein the at least one surface is defined by a porous material, and wherein at least a portion of the at least one liquid delivery member is embedded in the porous material and configured to deliver the liquid that travels through the porous material to the at least one surface.

16. A liquid distribution system configured to remove heat from a plurality of computing devices in a data center, the liquid distribution system comprising:
- a frame that defines a plurality of conduits that are substantially parallel to each other and in fluid communication with an internal environment of the data center, wherein the frame is configured to be at least partially buried under a ground, and the plurality of conduits each comprise at least one surface wetted with a liquid;
- at least one liquid delivery member that is maintained at a temperature below a dew point of surrounding air so as to generate condensation that is disposed on the at least one surface to define the liquid;
- wherein source air is directed to flow over the liquid substantially parallel to the at least one surface so as to produce cold air, and the cold air flows towards and passes through the plurality of computing devices so as to remove heat from the plurality of computing devices.

17. The liquid distribution system of claim 16, wherein the at least one surface is defined by a porous material, and the at least one liquid delivery member is embedded in the porous material and configured to deliver liquid that travels through the porous material to the at least one surface.

18. The liquid distribution system of claim 16, wherein the first at least one surface defines at least one fin so as to increase a surface area of the first at least one surface.

19. The liquid distribution system of claim 16, wherein the frame comprises a first material that defines the first at least one surface, a second material that defines a second at least one surface, wherein the second material is less permeable with respect to the liquid than the first material.

20. The liquid distribution system of claim 19, wherein the at least one liquid delivery member is embedded between the first at least one surface and the second at least one surface.

* * * * *